US012599023B2

(12) United States Patent
Shao et al.

(10) Patent No.: US 12,599,023 B2
(45) Date of Patent: Apr. 7, 2026

(54) SEMICONDUCTOR STRUCTURE AND METHOD FOR FORMING THE SAME AND SEMICONDUCTOR DEVICE

(71) Applicant: Winbond Electronics Corp., Taichung City (TW)

(72) Inventors: Po-Chun Shao, Hsinchu City (TW); Ping-Lung Yu, Hsinchu City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 419 days.

(21) Appl. No.: 18/485,574

(22) Filed: Oct. 12, 2023

(65) Prior Publication Data

US 2025/0070068 A1    Feb. 27, 2025

(30) Foreign Application Priority Data

Aug. 22, 2023    (TW) .................................. 112131449

(51) Int. Cl.
*H01L 23/00* (2006.01)

(52) U.S. Cl.
CPC .............. *H01L 24/13* (2013.01); *H01L 24/11* (2013.01); *H01L 24/16* (2013.01); *H01L 2224/11462* (2013.01); *H01L 2224/1151* (2013.01); *H01L 2224/13022* (2013.01); *H01L 2224/13076* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13166*

(2013.01); *H01L 2224/13169* (2013.01); *H01L 2224/13184* (2013.01); *H01L 2224/16227* (2013.01); *H01L 2924/05432* (2013.01); *H01L 2924/35121* (2013.01)

(58) Field of Classification Search
None
See application file for complete search history.

(56) References Cited

U.S. PATENT DOCUMENTS

| | | | |
|---|---|---|---|
| 10,197,520 B2 * | 2/2019 | Merz ..................... | G01N 27/125 |
| 10,553,358 B2 | 2/2020 | Bachman et al. | |
| 2006/0138394 A1 | 6/2006 | Den et al. | |

* cited by examiner

*Primary Examiner* — Kyoung Lee
(74) *Attorney, Agent, or Firm* — MUNCY, GEISSLER, OLDS & LOWE, P.C.

(57) ABSTRACT

A semiconductor structure includes a semiconductor substrate, an insulating layer, a conductive feature and an anisotropic conductive structure. The insulating layer is disposed above the semiconductor substrate. The conductive feature is disposed in the insulating layer, wherein a top surface of the conductive feature is adjacent to a top surface of the insulating layer. The anisotropic conductive structure is disposed on the insulating layer and the conductive feature. The anisotropic conductive structure includes a metal oxide porous layer and conductive pillars. The metal oxide porous layer has a first nano-through-hole array exposing the top surface of the conductive feature and a second nano-through-hole array exposing the top surface of the insulating layer. The conductive pillars fill the first nano-through-hole array, wherein the conductive pillars are in contact with the top surface of the conductive feature.

15 Claims, 5 Drawing Sheets

SEMICONDUCTOR STRUCTURE AND METHOD FOR FORMING THE SAME AND SEMICONDUCTOR DEVICE

CROSS REFERENCE TO RELATED APPLICATIONS

This application claims priority of Taiwan Patent Application No. 112131449, filed on Aug. 22, 2023, the entirety of which is incorporated by reference herein.

BACKGROUND OF THE INVENTION

Field of the Invention

The present disclosure relates to a semiconductor structure; a method for forming a semiconductor package; and a semiconductor device, and in particular, it related to a conductive structure of a semiconductor package and a method for forming a semiconductor package.

Description of the Related Art

With the development of semiconductor packaging technology and the increase in pitch density. The heat dissipation of the chips has become a key factor affecting the performance and reliability of electronic devices. In semiconductor packaging applications, anisotropic conductive adhesive (ACA) can be used to replace solder as the electrical connection component of semiconductor packages because it shows thermal and electrical conductivity in a specific direction only. However, the thermal conductivity of the anisotropic conductive adhesive material is much lower than that of metal, and it does not match the coefficient of thermal expansion (CTE) of the semiconductor package, resulting in the chip cracking and delamination problems. In addition, the anisotropic conductive adhesive is mainly made of organic materials, which have poor thermal stability, resulting in a decline in mechanical properties over time, thereby reducing the reliability of the semiconductor package.

Therefore, there is a need for an electrical connection component of a semiconductor package to solve the aforementioned problems.

BRIEF SUMMARY OF THE INVENTION

An embodiment of the disclosure provides a semiconductor structure. The semiconductor structure includes a semiconductor substrate, an insulating layer, a conductive feature and an anisotropic conductive structure. The insulating layer is disposed over the semiconductor substrate. The conductive feature is disposed in the insulating layer. A top surface of the conductive feature is adjacent to a top surface of the insulating layer. The anisotropic conductive structure is disposed on the insulating layer and the conductive feature. The anisotropic conductive structure includes a porous metal oxide layer and conductive pillars. The porous metal oxide layer has a first nano-through-hole array exposing the top surface of the conductive feature and a second nano-through-hole array exposing the top surface of the insulating layer. The conductive pillars fill the first nano-through-hole array. The conductive pillars are in contact with the top surface of the conductive feature.

An embodiment of the disclosure provides a semiconductor device. The semiconductor device includes a semiconductor substrate, an insulating layer, a conductive feature, an anisotropic conductive structure and a circuit substrate. The insulating layer is disposed over the semiconductor substrate. The conductive feature is disposed in the insulating layer. A top surface of the conductive feature is adjacent to a top surface of the insulating layer. The anisotropic conductive structure is disposed on the insulating layer and the conductive feature. The anisotropic conductive structure includes a porous metal oxide layer and conductive pillars. The porous metal oxide layer has a first nano-through-hole array exposing the top surface of the conductive feature and a second nano-through-hole array exposing the top surface of the insulating layer. The conductive pillars fill the first nano-through-hole array. The conductive pillars are in contact with the top surface of the conductive feature. The circuit substrate has bonding pads on it. The bonding pads are in contact with the conductive pillars.

Another embodiment of the disclosure provides a method for forming a semiconductor structure. The method includes providing a semiconductor substrate. The method further includes forming a conductive pad over the semiconductor substrate. The method further includes forming an insulating layer on the conductive pad. The insulating layer has an opening to expose the conductive pad. The method further includes forming a metal layer on the insulating layer. The metal layer is formed through the opening and in contact with the conductive pad. The method further includes performing an anodizing process cycle on the metal layer to oxidize a portion of the metal layer on the insulating layer to form a porous metal oxide layer. The porous metal oxide layer has a first nano-through-hole array exposing the metal layer that is unoxidized and a second nano-through-hole array exposing the insulating layer. The method further includes performing a selective deposition process to form conductive pillars filling the first nano-through-hole array.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
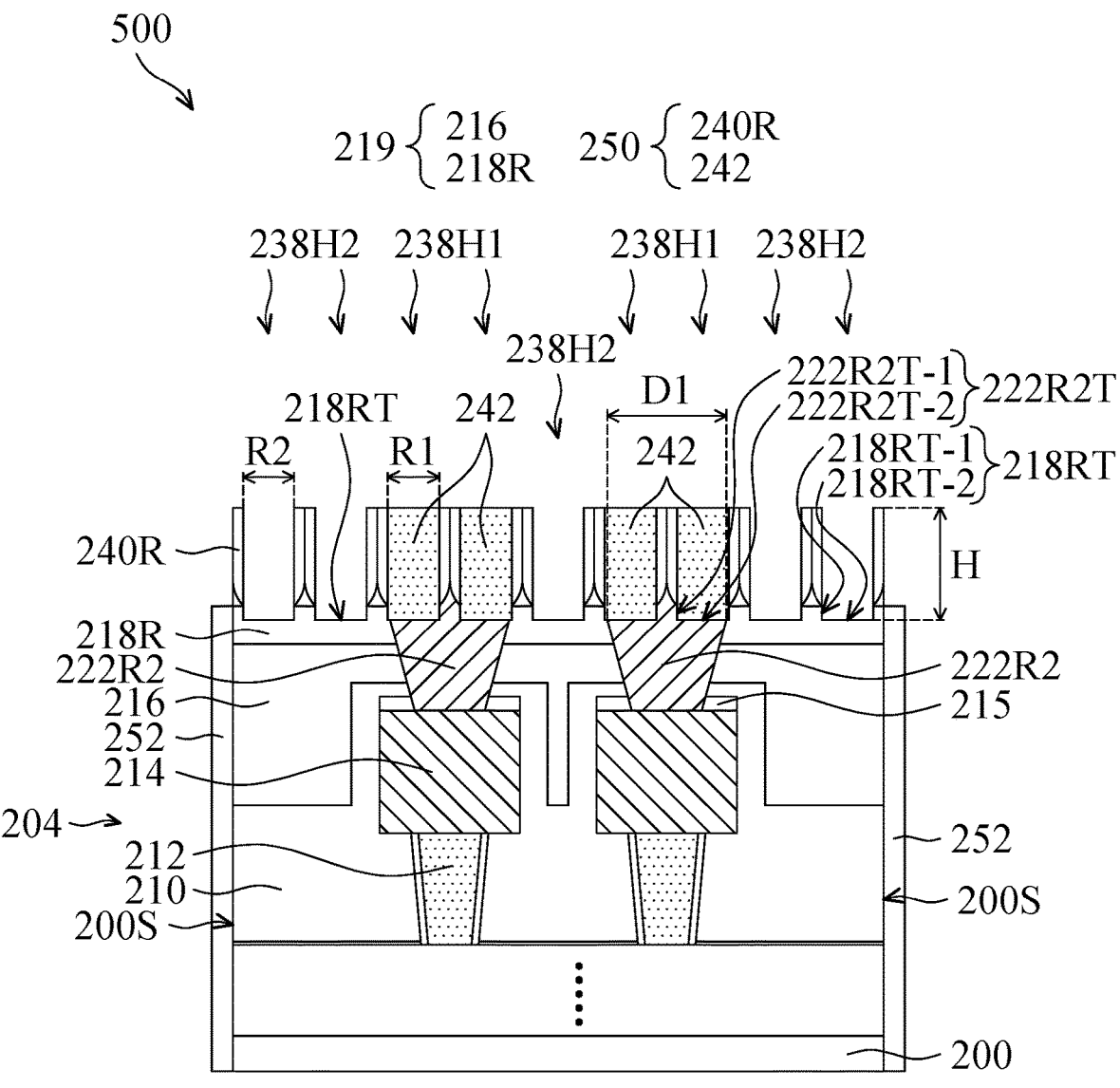
FIG. 1 is a schematic cross-sectional view of a semiconductor structure in accordance with some embodiments of the disclosure.

FIG. 1 is a schematic cross-sectional view of a semiconductor structure 500 in accordance with some embodiments of the disclosure. In one embodiment, the semiconductor structure 500 includes a semiconductor package formed using a wafer level chip packaging (WLCSP) process. As shown in FIG. 1, the semiconductor structure 500 includes a semiconductor substrate 200, an insulating layer 218R, a conductive feature 222R2 and an anisotropic conductive structure 250. In an embodiment, the semiconductor substrate 200 may be an elemental semiconductor substrate, such as a silicon substrate or a germanium substrate; or a compound semiconductor substrate, such as a silicon carbide substrate or a gallium arsenide substrate. In one embodiment, the semiconductor substrate 200 may be a silicon-on-insulator substrate.

The semiconductor structure 500 further includes electronic devices and an interconnect structure 204 formed on the semiconductor substrate 200 (the electronic devices and portions of the interconnect structure 204 are illustrated as a row of dots located over the semiconductor substrate 200 in FIG. 1). In one embodiment, the interconnect structure 204 is electrically connected to the electronic devices, and includes a plurality of alternating laminated metal layers (including conductive pads 214) and dielectric layers (including a dielectric layer 210 and a capping layer 215), and a plurality of vias (including vias 212) passing through the dielectric layers. As shown in FIG. 1, the dielectric layer 210, the via 212 and the conductive pad 214 respectively belong to the topmost dielectric layer, the topmost via and the topmost metal layer of the interconnect structure 204. The dielectric layer 210 and the capping layer 215 may include silicon oxide, silicon nitride, silicon oxynitride, phosphosilicate glass, boron phosphosilicate glass, low dielectric constant (low-k) materials, SiCO, SiCN, SiC, and/or a combination thereof. The via 212 may include tungsten, aluminum, nickel, cobalt, platinum, titanium, copper, gold, silver or a combination thereof. The conductive pads 214 may include aluminum, copper, cobalt, titanium, gold, silver, platinum or alloys thereof. In this embodiment, the conductive pad 214 includes aluminum.

The semiconductor structure 500 further includes insulating layers 216 and 218R disposed over the semiconductor substrate 200. The insulating layer 216 covers the interconnect structure 204 and has a flat surface. The insulating layer 218R covers the insulating layer 216. In addition, the insulating layers 216 and 218R have openings (not shown) to expose a portions of the conductive pad 214. In one embodiment, a top surface 218RT of the insulating layer 218R is a periodic concave and convex surface, which has convex portions 218RT-1 and concave portions 218RT-2. The insulating layers 216 and 218R may include silicon-based materials, such as silicon oxide, silicon nitride, silicon oxynitride, carbon-doped silicon nitride, or carbon-doped silicon oxide. The insulating layers 216 and 218R may collectively serve as a protective layer structure 219 to protect the underlying interconnect structure 204 and electronic devices (not shown). In one embodiment, the insulating layer 216 and the insulating layer 218R may include different silicon-based materials. For example, the insulating layer 216 may be silicon oxide, and the insulating layer 218R may be silicon nitride.

The conductive feature 222R2 is disposed in the openings (not shown) of the insulating layers 216 and 218R and is connected to the conductive pad 214. A top surface 222R2T of the conductive feature 222R2 may be adjacent to a top surface 218RT of the insulating layer 218R. In one embodiment, the top surface 222R2T of the conductive feature 222R2 is a periodic concave and convex surface, which has convex portions 222R2T-1 and concave portions 222R2T-2. Furthermore, the top surface 222R2T of the conductive feature 222R2 and the top surface 218RT of the insulating layer 218R have the same or similar cross-sectional profiles and period of the concave and convex surfaces. In one embodiment, the conductive feature 222R2 and the conductive pad 214 include the same material. For example, the conductive feature 222R2 may include aluminum. When the conductive feature 222R2 and conductive pad 214 include the same material, there may be no interface between conductive feature 222R2 and conductive pad 214.

The anisotropic conductive structure 250 is disposed on the insulating layer 218R and the conductive feature 222R2. In one embodiment, the anisotropic conductive structure 250 includes a porous metal oxide layer 240R and conductive pillars 242. The porous metal oxide layer 240R has a first nano-through-hole array 238H1 and a second nano-through-hole array 238H2. The first nano-through-hole array 238H1 passes through the porous metal oxide layer 240R and exposes the top surface 222R2T of the conductive feature 222R2. In addition, the second nano-through-hole array 238H2 passes through the porous metal oxide layer 240R and exposes the top surface 218RT of the insulating layer 218R. As shown in FIG. 1, first nano-through-holes of the first nano-through-hole array 238H1 may have a first aperture R1. Second nano-through-holes of the second nano-through-hole array 238H2 may have a second aperture R2. In addition, the first nano-through-hole array 238H1 and the second nano-through-hole array 238H2 may have the same height H of the nano-through-holes. Furthermore, the conductive feature 222R2 may have a first lateral dimension D1. In one embodiment, the first aperture R1 may be equal to the second aperture R2. Also, the first radius R1 may be smaller than the first lateral (horizontal) dimension D1. In one embodiment, the through-hole aspect ratio (the ratio of the height H of the nano-through-holes to the first aperture R1) of the first nano-through-hole array 238H1 may be between 1 and 1000. If the through-hole aspect ratio of the first nano-through-hole array 238H1 is less than 1, the conductive pillars 242 will cross multiple conductive features 222R2, and a short circuit phenomenon will occur. If the through-hole aspect ratio of the first nano-through-hole array 238H1 is greater than 1000, the volume of the anisotropic conductive structure 250 will be too large to shrink the volume of the packaged product.

As shown in FIG. 1, the porous metal oxide layer 240R is in contact with the convex portion 218RT-1 of the top surface 218RT of the insulating layer 218R and the convex portion 222R2T-1 of the top surface 222R2T of the conductive feature 222R2. Furthermore, the convex portion 218RT-1 of the top surface 218RT of the insulating layer 218R and the convex portion 222R2T-1 of the top surface 222R2T of the conductive feature 222R2 extend into the porous metal oxide layer 240R. In addition, the convex portion 222R2T-1 of the top surface 222R2T of the conductive feature 222R2 is in contact with the porous metal oxide layer 240R. In one embodiment, the porous metal oxide layer 240R includes anodic aluminum oxide material.

The conductive pillars 242 of the anisotropic conductive structure 250 selectively fill the first nano-through-hole array 238H1 and surrounded by the porous metal oxide layer 240R. Furthermore, the conductive pillars 242 are in contact with the concave portions 222R2T-2 of the top surface 222R2T of the conductive feature 222R2. As shown in FIG. 1, the second nano-through-hole array 238H2 is not filled with conductive pillars 242. In other words, the second nano-through-hole array 238H2 is filled with air, and the conductive pillars 242 are not in contact with the insulating layer 218R. In one embodiment, the conductive pillars 242 include metal, such as copper, aluminum, cobalt, nickel, titanium, gold, silver, platinum, tungsten, or a combination thereof.

The method for forming the semiconductor structures 500 would be described below.

Figure 2:
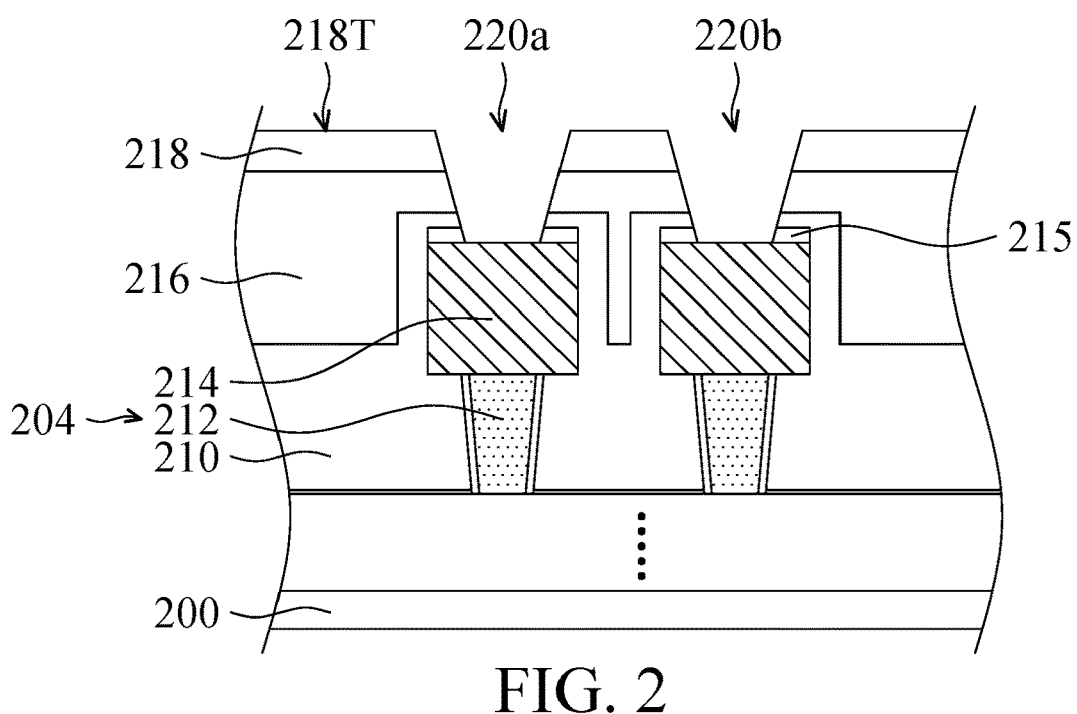
FIGS. 2, 3, 4, 5, 6, 7, 8, and 9 are schematic cross-sectional views of intermediate stages of forming the semiconductor structure shown in FIG. 1 in accordance with some embodiments of the disclosure.

Referring to FIG. 2, a semiconductor substrate 200 is provided. The semiconductor substrate 200 may be a portion of a semiconductor wafer. Next, a deposition process and subsequent lithography and etching processes are performed to form the electronic devices and the dielectric layer 210, the vias 212 in the dielectric layer 210, the conductive pads 214 on the vias 212 and the capping layer 215 on the conductive pad 214 of the interconnect structure 204.

Next, a deposition process is performed to form insulating layers 216 and 218 on the dielectric layer 210 and the conductive pads 214. Next, a photolithography process and an etching process are performed to form openings 220*a* and 220*b* in the insulating layers 216 and 218 and the capping layer 215 that expose portions of the conductive pads 214.

Figure 3:
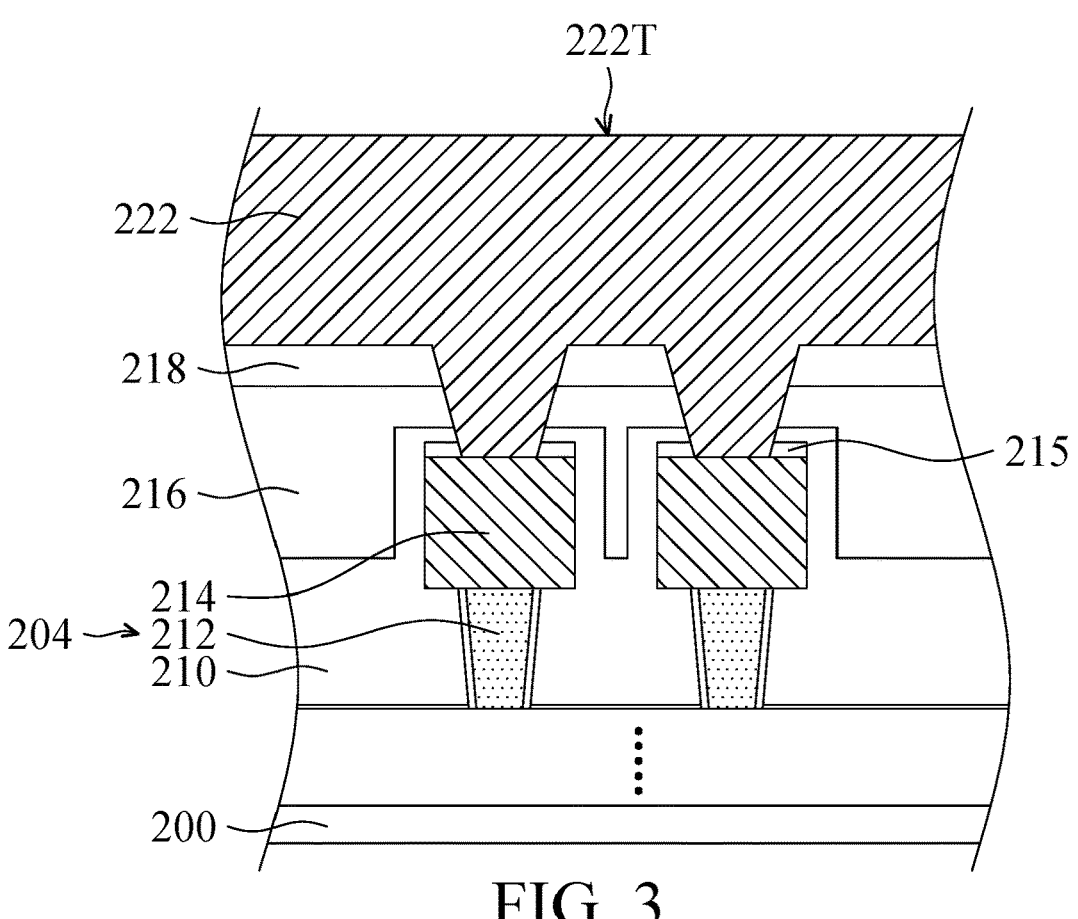

Next, as shown in FIG. 3, a deposition process such as physical vapor deposition, chemical vapor deposition, atomic layer deposition, sputtering, or a combination thereof is performed to form a metal layer 222 on the insulating layer 218 and filling the openings 220*a* and 220*b*. A top surface 222T of the metal layer 222 is substantially a flat surface. In addition, the metal layer 222 is formed through the openings 220*a* and 220*b* to be in contact with the conductive pad 214.

Figure 4:
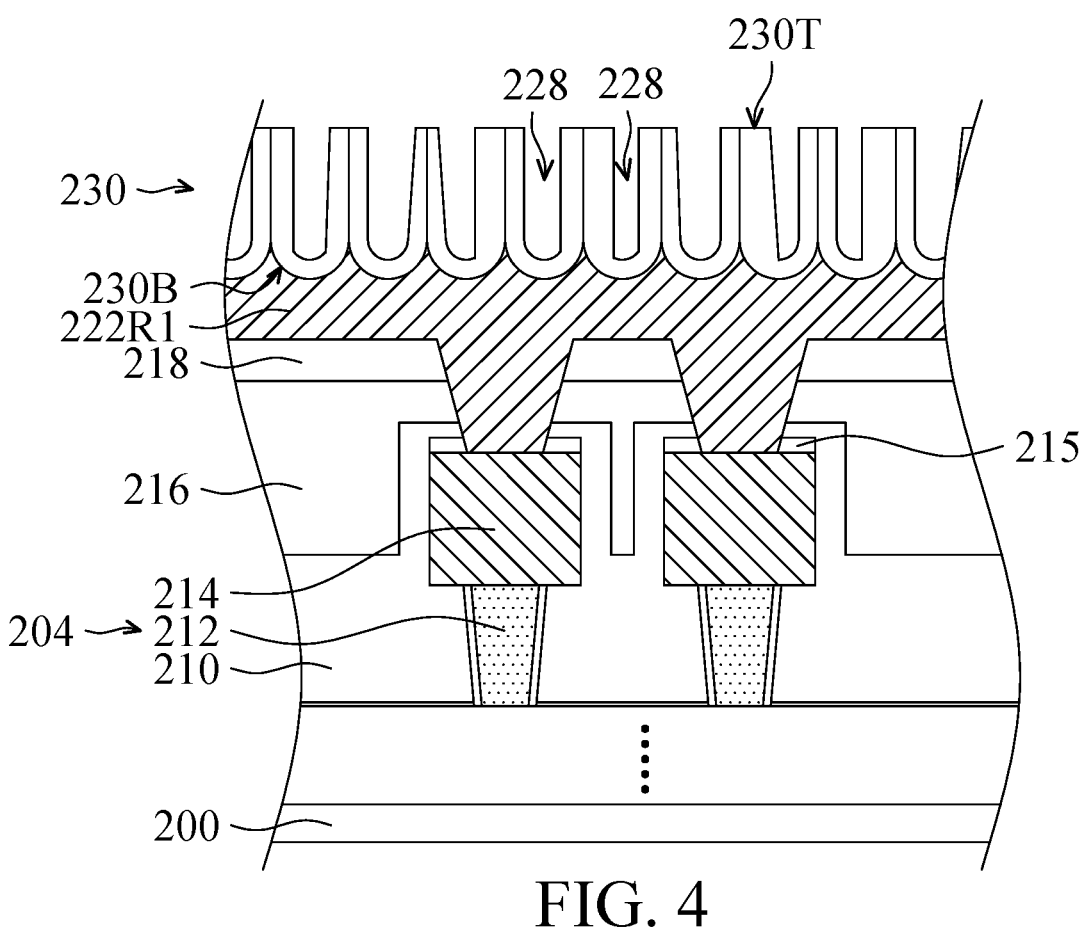
Figure 5:
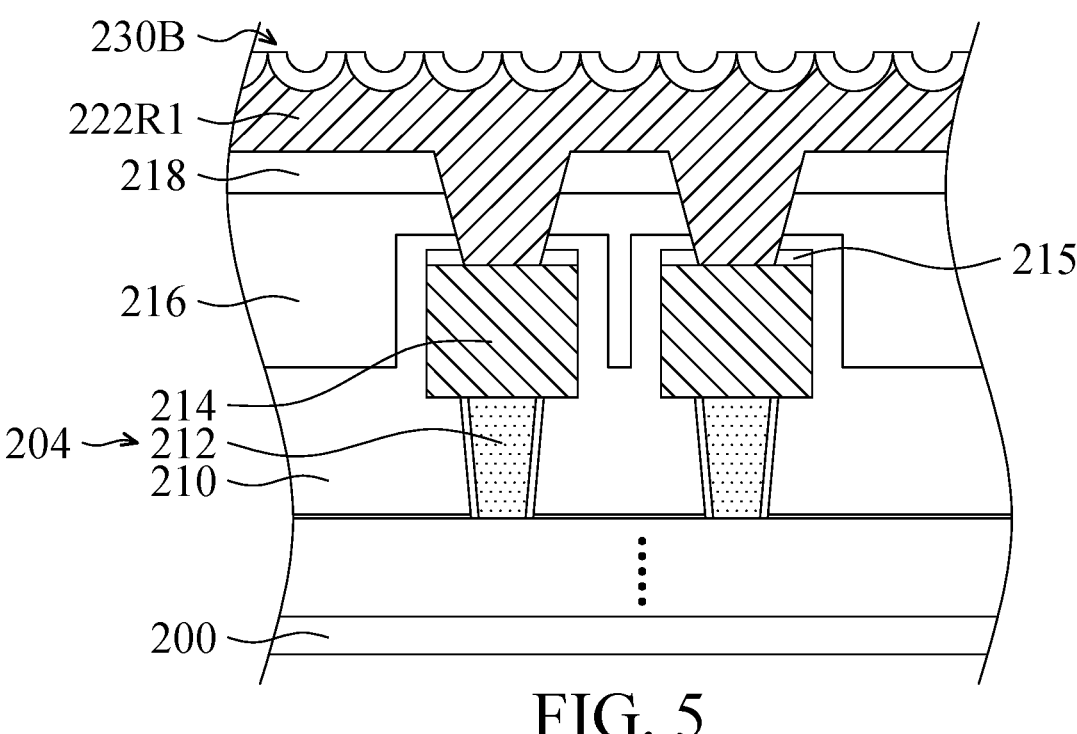
Figure 6:
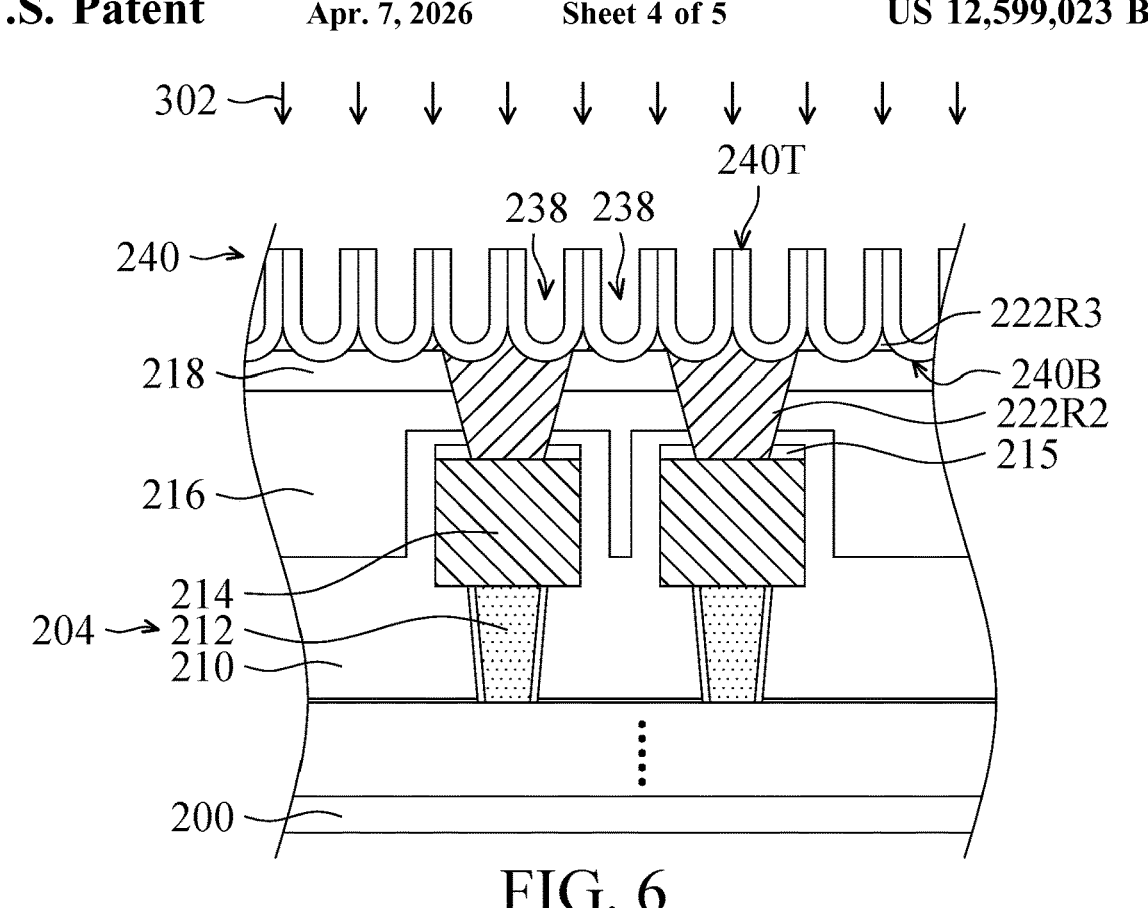
Figure 7:
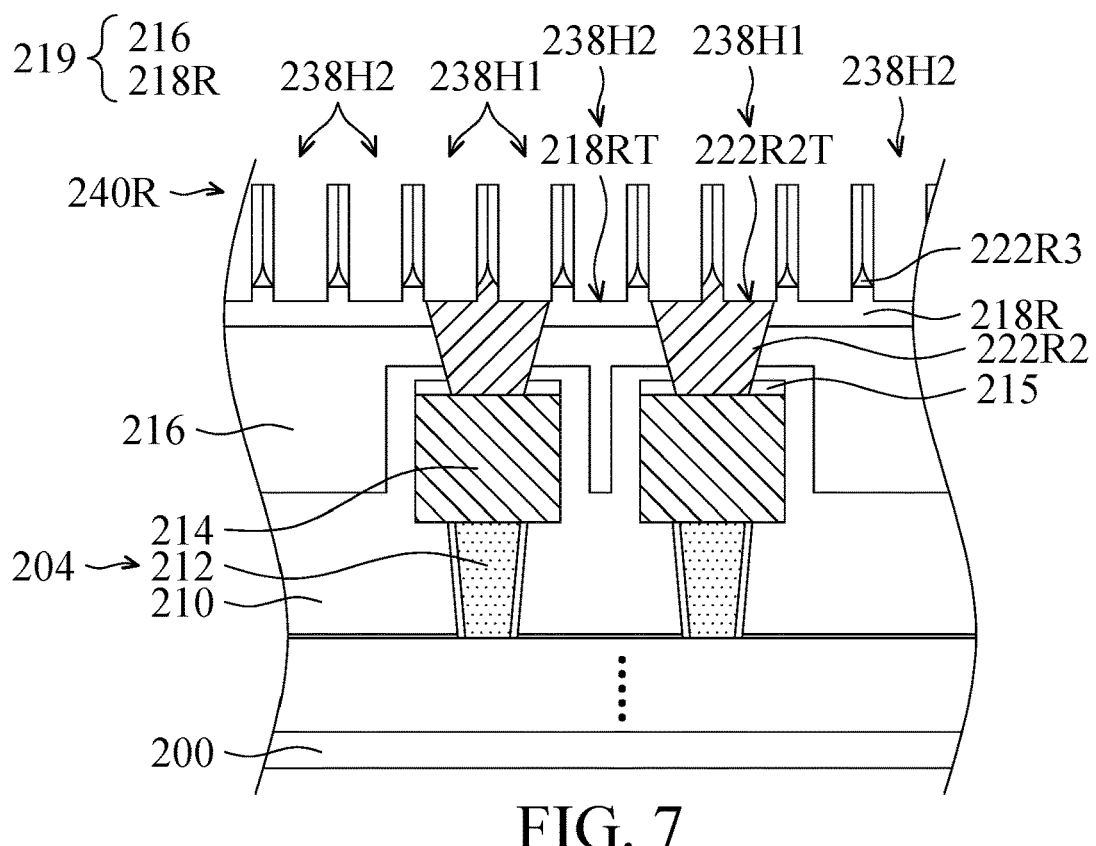

Next, the anodizing process cycle shown in FIGS. 4 to 7 are performed on the metal layer 222 to form the porous metal oxide layer 240R (FIG. 7). As shown in FIG. 4, a first anodizing process 300 is performed on the metal layer 222 to oxidize a portion of the metal layer 222 close to the top surface 222T (FIG. 3) of the metal layer 222 to form a porous metal oxide layer 230. In one embodiment, the metal layer 222, such as aluminum, may be placed in an electrolyte of sulfuric acid ($H_2SO_4$), phosphoric acid ($H_3PO_4$), chromic acid ($H_2CrO_4$), or oxalic acid ($C_2H_2O_4$). In addition, a voltage is applied to the metal layer 222 to form the porous metal oxide layer 230 such as anodic aluminum oxide (AAO). As shown in FIG. 4, the porous metal oxide layer 230 includes a surface portion having nanoholes 228 and a periodic wavy bottom 230B. The cylindrical nanoholes 228 extend from the top surface 230T of the porous metal oxide layer 230 into a portion of the metal oxide layer 230. In addition, the cylindrical nanoholes 228 are periodically arranged and vertically aligned to the top surface 230T of the porous metal oxide layer 230 (for example, arranged in a honeycomb pattern). The aperture, aspect ratio, and density of the nanoholes 228 may be adjusted by controlling the process parameters of the first anodizing process 300 (such as process temperature, process time, type and concentration of the electrolyte, and applied voltage to the metal layer 222). In addition, the periodic wavy bottom 230B of the porous metal oxide layer 230 is connected to the unoxidized metal layer 222R1 to separate the unoxidized metal layer 222R1 from the nanoholes 228.

Next, as shown in FIG. 5, an acid pickling process is performed to remove a portion of the porous metal oxide layer 230, leaving the periodic wavy bottom 230B on the unoxidized metal layer 222R1. In one embodiment, the porous metal oxide layer 230 may be placed in an acid solution of phosphoric acid, chromic acid or oxalic acid to remove the surface portion of the porous metal oxide layer 230 that has uneven pore diameters and pore density, leaving the periodic wavy bottom 230B that has relatively uniform pore diameter and hole density. The remaining periodic wavy bottom 230B that has relatively uniform pore diameter and hole density serves as the base for the subsequent second anodizing process to facilitate forming a porous metal oxide layer having a uniform nano-through-hole array in the subsequent processes.

Next, as shown in FIG. 6, a second anodizing process 302 is performed on the periodic wavy bottom 230B and the unoxidized metal layer 222R1 (FIG. 5), so that a portion of the unoxidized metal layer 222R1 on the insulating layer

218 (FIG. 5) is oxidized to form a second porous metal oxide layer 240. In addition, the unoxidized metal layer remaining in the openings 220*a* and 220*b* (FIG. 2) of the insulating layer 218 forms the conductive features 222R2. As shown in FIG. 6, the porous metal oxide layer 240 has nanoholes 238 and a periodic wavy bottom 240B. The cylindrical nanoholes 238 extend from the top surface 240T of the porous metal oxide layer 240 into a portion of the metal oxide layer 240. In addition, the cylindrical nanoholes 238 are periodically arranged and vertically aligned to the top surface 240T of the porous metal oxide layer 240 (for example, arranged in a honeycomb pattern). Since the unoxidized metal layer 222R1 has a surface profile corresponding to the periodic wavy bottom 230B (FIG. 5), the porous metal oxide layer 240 having a relatively uniform pore size and hole density may be formed after performing the second anodizing process 302. In one embodiment, the second anodizing process 302 may have the same or different process parameters as the first anodizing process 300 (such as, process temperature, process time, type and concentration of the electrolyte, and applied voltage to the non-oxidized metal layer 222R1) to adjust the hole diameter, hole aspect ratio and hole density of the nanoholes 238. The periodic wavy bottom 240B of the porous metal oxide layer 240 may be in contact with the insulating layer 218 and the conductive feature 222R2 located in the openings 220*a*, 220*b* (FIG. 2) of the insulating layer 218 to isolate the conductive feature 222R2 from the nanoholes 238. In addition, an unoxidized metal layer 222R3 may remain between the top surface 218T (FIG. 2) of the insulating layer 218 and a portion of the partially periodic wavy bottom 240B between the nanoholes 238.

Next, as shown in FIG. 7, a removal process is performed to remove the periodic wavy bottom 240B until the insulating layer 218 and the conductive feature 222R2 located in the insulating layer 218 are exposed. The removal process may use phosphoric acid, chromic acid, oxalic acid or sodium hydroxide (NaOH) to remove the periodically wavy bottom 240B exposed from the nanoholes 238 and portions of the insulating layer 218 located directly below the nanoholes 238 to form the insulating layer 218R. In addition, the removal process may have a hole expansion effect. After performing the removal process, the porous metal oxide layer 240R having the first nano-through-hole array 238H1 and the second nano-through-hole array 238H2 is formed on the insulating layer 218R. As shown in FIG. 7, after removing the periodic wavy bottom 240B, the insulating layer 218R and the conductive feature 222R2 respectively have periodic concave and convex surfaces (top surfaces) 218RT and 222R2T. The first nano-through-hole array 238H1 exposes the top surface 222R2T of the conductive feature 222R2, and the second nano-through-hole array 238H2 exposes the top surface 218RT of the insulating layer 218R.

Figure 8:
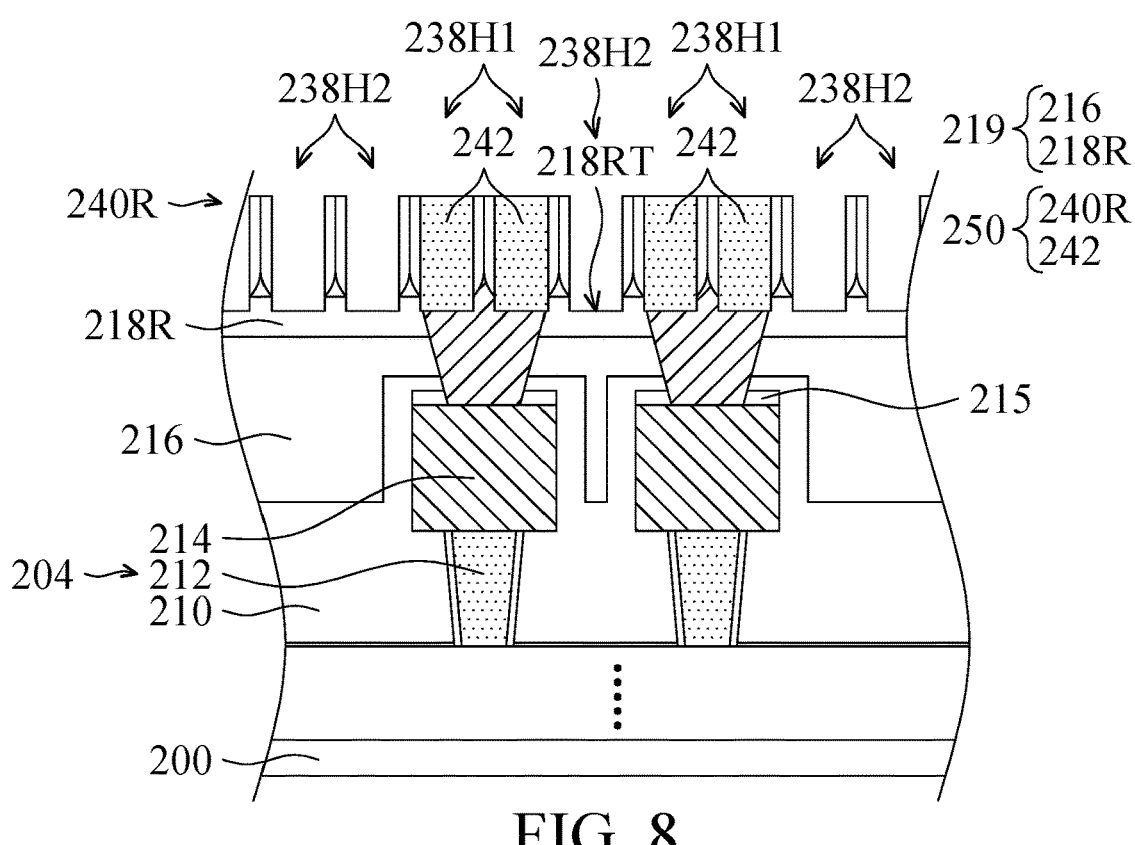

Next, as shown in FIG. 8, a selective deposition process such as electroplating is performed to deposit metal in the first nano-through-hole array 238H1 to form a conductive pillars 242 filling the first nano-through-hole array 238H1. During the selective deposition process such as electroplating, the metal is only deposited in the first nano-through-hole array 238H1 exposing the top surface 222R2T of the conductive feature 222R2, but not in the second nano-through-hole array 238H2 exposing the top surface 218RT of the insulating layer 218. That is to say, no conductive pillars will be formed in the second nano-through-hole array 238H2 (the second nano-through-hole array 238H2 is only filled with air). Therefore, the formation position of the conductive pillar 242 may be defined in a self-aligned manner without performing photolithography and etching processes. The conductive pillar 242 may be used as a vertical electrical connection feature between the conductive feature 222R2 and an external circuit or electronic component (such as a circuit substrate or other electronic devices). Moreover, adjacent conductive pillars 242 are laterally separated from each other by the porous metal oxide layer 240R, and the size of the conductive pillars 242 in contact with the same conductive feature 222R2 (corresponding to the first aperture R1 of the first nano-through-hole array 238H1 in FIG. 1) may be smaller than the first lateral dimension D1 of conductive feature 222R2 (FIG. 1). Additionally, the conductive pillars 242 in contact with different conductive features 222R2 may be laterally separated by the second nano-through-hole array 238H2 filled with air. Therefore, even if the size and pitch of the conductive features 222R2 are reduced, the problem of lateral (horizontal) short circuit will not occur. After performing the aforementioned processes, the anisotropic conductive structure 250 including the porous metal oxide layer 240R and the conductive pillars 242 is formed.

Next, a cutting process is performed on the semiconductor substrate 200, the interconnect structure 204, the protective layer structure 219 and the anisotropic conductive structure 250 to separate them into semiconductor packages. It is noted that although the semiconductor structure shown in the aforementioned figures is fabricated as a single semiconductor package, in actual manufacturing processes, multiple identical semiconductor packages may be fabricated simultaneously on the same semiconductor substrate 200.

Next, as shown in FIG. 1, a protective layer 252 is formed on sidewalls 200S of the semiconductor package. After performing the aforementioned processes, the semiconductor structure 500 such as a semiconductor package is formed.

Figure 9:
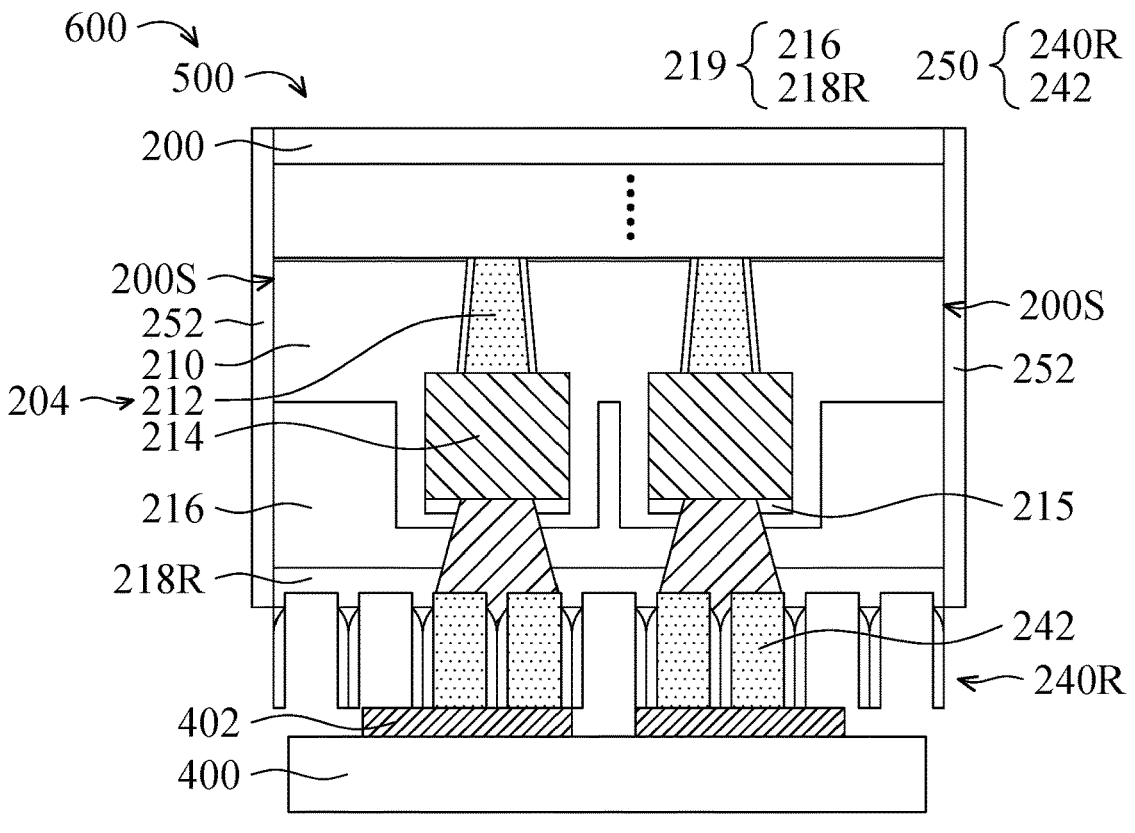

As shown in FIG. 9, in other embodiments, the semiconductor structure 500 may be bonded to a circuit substrate 400 such as a printed circuit board (PCB) or a package substrate, so that the conductive pillars 242 are in contact with bonding pads 402 disposed on the circuit substrate 400 to form a semiconductor device 600 such as a semiconductor package component.

Embodiments of the invention provide a semiconductor structure, a method for forming a semiconductor structure, and a semiconductor device. For example, the semiconductor structure such as a semiconductor package uses a porous metal oxide layer and conductive pillars filled within as anisotropic (in a vertical direction) conductive structures electrically connected between the conductive pads and an external circuit or electronic components (such as a circuit substrate). In one embodiment, the porous metal oxide layer includes anodic aluminum oxide, which has nano-through-hole arrays formed of individual nano-through-holes vertically passing through the porous metal oxide layer to serve as a support layer for the conductive pillars. In one embodiment, the conductive pillars such as copper selectively fill the nano-through-hole array exposing the conductive pads and do not fill the nano-through-hole array exposing the protective layer. Compared with anisotropic conductive adhesive (ACA) used as the external conductive structure of the conventional semiconductor package, the porous metal oxide layer in some embodiments of the invention is formed of anodic aluminum oxide having high-hardness. In addition, the thermal expansion coefficient (the thermal expansion coefficient of anodic aluminum oxide is about 5.4 ppm/K) of the porous metal oxide layer formed of anodic aluminum oxide have a better match with the thermal expansion coefficient of the protective layer of silicon-based materials (the thermal expansion coefficient of silicon is about 2.5 ppm/K), which may avoid the problems such as cracking, peeling or delamination of the external conductive structure occurring when the semiconductor package is subjected the long-term high-temperature and low-temperature cycles. Moreover, the conductive pillars made of copper, for example, may have better electrical and thermal conductivity properties than anisotropic conductive glue. In addition, the conductive pillars may be selectively formed in nano-through-holes exposing the conductive pads by deposition process such as electroplating. The formation positions of the conductive pillars may be defined in a self-aligned manner without additional photolithography and etching processes, thereby providing the vertical conductive structures having high density and fine-pitch. Furthermore, the problem of lateral (horizontal) short circuit can be avoided.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a semiconductor substrate;
   an insulating layer disposed over the semiconductor substrate;
   a conductive feature disposed in the insulating layer, wherein a top surface of the conductive feature is adjacent to a top surface of the insulating layer; and
   an anisotropic conductive structure disposed on the insulating layer and the conductive feature, wherein the anisotropic conductive structure comprises:
      a porous metal oxide layer having a first nano-through-hole array exposing the top surface of the conductive feature and a second nano-through-hole array exposing the top surface of the insulating layer; and
      conductive pillars filling the first nano-through-hole array, wherein the conductive pillars are in contact with the top surface of the conductive feature.

2. The semiconductor structure as claimed in claim 1, wherein the second nano-through-hole array is not filled with the conductive pillars.

3. The semiconductor structure as claimed in claim 1, wherein the porous metal oxide layer comprises anodized aluminum materials.

4. The semiconductor structure as claimed in claim 3, wherein the insulating layer comprises silicon-based materials.

5. The semiconductor structure as claimed in claim 1, wherein the conductive pillars include metals.

6. The semiconductor structure as claimed in claim 1, wherein in a cross-sectional view, the first nano-through-holes of the first nano-through-hole array have a first aperture, the conductive feature has a first lateral dimension, and wherein the first aperture is smaller than the first lateral dimension.

7. The semiconductor structure as claimed in claim 1, wherein the top surface of the conductive feature is a periodic concave and convex surface, the periodic concave and convex surface of the conductive feature has convex portions and concave portions, and wherein the convex portions are in contact with the porous metal oxide layer.

8. The semiconductor structure as claimed in claim 7, wherein the concave portions of the periodic concave and convex surface of the conductive feature are in contact with the conductive pillars.

9. The semiconductor structure as claimed in claim 1, wherein the top surface of the insulating layer is a periodic concave and convex surface, the periodic concave and convex surface of the insulating layer has convex portions and concave portions, and wherein the convex portions extend into the porous metal oxide layer.

10. A semiconductor device, comprising:

a semiconductor substrate;

an insulating layer disposed over the semiconductor substrate;

a conductive feature disposed in the insulating layer, wherein a top surface of the conductive feature is adjacent to a top surface of the insulating layer;

an anisotropic conductive structure disposed on the insulating layer and the conductive feature, wherein the anisotropic conductive structure comprises:

a porous metal oxide layer having a first nano-through-hole array exposing the top surface of the conductive feature and a second nano-through-hole array exposing the top surface of the insulating layer; and conductive pillars filling the first nano-through-hole array, wherein the conductive pillars are in contact with the top surface of the conductive feature; and a circuit substrate, wherein the circuit substrate has bonding pads on it, wherein the bonding pads are in contact with the conductive pillars.

11. A method for forming a semiconductor structure, comprising:

providing a semiconductor substrate;

forming a conductive pad over the semiconductor substrate;

forming an insulating layer on the conductive pad, wherein the insulating layer has an opening to expose the conductive pad;

forming a metal layer on the insulating layer, wherein the metal layer is formed through the opening and in contact with the conductive pad;

performing an anodizing process cycle on the metal layer to oxidize a portion of the metal layer on the insulating layer to form a porous metal oxide layer, wherein the porous metal oxide layer has a first nano-through-hole array exposing the metal layer that is unoxidized and a second nano-through-hole array exposing the insulating layer; and performing a selective deposition process to form conductive pillars filling the first nano-through-hole array.

12. The method for forming a semiconductor structure as claimed in claim 11, wherein the anodizing process cycle comprises:

performing a first anodizing process on the metal layer to oxidize another portion of the metal layer to form a first porous metal oxide layer, wherein the first porous metal oxide layer has first nanoholes and a first periodic wavy bottom;

removing a portion of the first porous metal oxide layer, leaving the first periodic wavy bottom on the metal layer that is unoxidized;

performing a second anodizing process on the first periodic wavy bottom and the metal layer that is unoxidized to oxidize a portion of the metal layer that is unoxidized on the insulating layer to form a second porous metal oxide layer, wherein the second porous metal oxide layer has second nanoholes and a second periodic wavy bottom; and removing this second periodic wavy bottom.

13. The method for forming a semiconductor structure as claimed in claim 12, wherein the second periodic wavy bottom is in contact with the insulating layer and the metal layer, wherein the metal layer is unoxidized, and the metal layer is located in the opening of the insulating layer.

14. The method for forming a semiconductor structure as claimed in claim 12, wherein after removing the second periodic wavy bottom, each of the insulating layer and the metal layer has a periodic concave and convex surface, wherein the metal layer is unoxidized, and the metal layer is located in the opening of the insulating layer.

15. The method for forming a semiconductor structure as claimed in claim 11, further comprising:

performing a cutting process on the semiconductor substrate and the porous metal oxide layer after forming the conductive pillars.

\* \* \* \* \*